United States Patent [19]

Hong

[11] Patent Number: 5,690,468

[45] Date of Patent: Nov. 25, 1997

[54] FAN ASSEMBLY FOR AN INTEGRATED CIRCUIT

[76] Inventor: Chen Fu-In Hong, No. 3, Lane 45, Yi-Yung Road, Kaohsiung, Taiwan

[21] Appl. No.: 668,629

[22] Filed: Jun. 19, 1996

[51] Int. Cl.[6] .................................................. F01D 29/58
[52] U.S. Cl. ........................ 415/177; 165/80.3; 165/121; 165/185; 361/697
[58] Field of Search ................................ 415/177, 178; 165/185, 80.3, 121; 361/697

[56] References Cited

U.S. PATENT DOCUMENTS

| | | | |
|---|---|---|---|
| 5,570,271 | 10/1996 | Lavochkin | 165/185 |
| 5,588,483 | 12/1996 | Ishida | 165/185 |
| 5,594,623 | 1/1997 | Schwegler | 165/185 |
| 5,602,719 | 2/1997 | Kinion | 165/185 |

*Primary Examiner*—John T. Kwon
*Attorney, Agent, or Firm*—Bacon & Thomas

[57] ABSTRACT

A fan assembly for an integrated circuit includes a finned plate, a board member securely mounted to the finned plate and including a hole defined in a mediate portion thereof, a fan device, and a heat conducting member. The finned plate includes a plurality of rows and columns of fins extending upwardly from an upper side thereof and a space defined in a center of the upper side, each two adjacent fins having a gap defined therebetween. The fan device is mounted to the board member and has a fan rotatably received in the space of the finned plate. The heat conducting member is securely connected to the finned plate or an integrated circuit.

4 Claims, 4 Drawing Sheets

FAN ASSEMBLY FOR AN INTEGRATED CIRCUIT

BACKGROUND OF THE INVENTION

1. Field of the Invention

The present invention relates to a fan assembly for an integrated circuit and, more particularly, to an improved fan assembly which provides a more effective heat dissipating effect.

2. Description of the Related Art

Applicant's U.S. patent application Ser. No. 08/604,487 filed on Feb. 21, 1996 discloses a fan device for an integrated circuit including a finned plate, a fan having a rotor shaft, and a board member mounted to the finned plate. The finned plate includes a plurality of rows and columns of fins extending upwardly from an upper side thereof and a space defined in a center of the upper side, each two adjacent fins having a gap defined therebetween. The board member includes a hole defined in a mediate portion thereof, a support member provided in the hole, and a plurality of ribs extending downwardly from a periphery defining the hole to the support member, the support member including a stud formed on an upper side thereof and having a second hole defined therein for rotatably receiving the rotor shaft of the fan.

The present invention is intended to provide an improved design having a more effective heat dissipating effect.

SUMMARY OF THE INVENTION

It is an object of the invention to provide a fan assembly for an integrated circuit which provides a more effective heat dissipating effect.

In a first embodiment of the invention, a fan assembly for an integrated circuit comprises a finned plate, a board member securely mounted to the finned plate and including a hole defined in a mediate portion thereof, a fan means, and a heat conducting member.

The finned plate includes a plurality of rows and columns of fins extending upwardly from an upper side thereof and a space defined in a center of the upper side, each two adjacent fins having a gap defined therebetween. The fan means is mounted to the board member and has a fan rotatably received in the space of the finned plate. The heat conducting member is securely connected to the finned plate or an integrated circuit.

In accordance with one aspect of the invention, the fan means includes a plurality of pins extending upwardly therefrom, and the board member includes a plurality of holes for receiving the pins of the fan means.

In accordance with a further aspect of the invention, the fan means further includes a plurality of spacers extending downwardly from a bottom side thereof to contact with the upper side of the finned plate defining the space.

In accordance with another aspect of the invention, the heat conducting member includes a first end fittingly received in one of the gaps of the finned plate and a second end extending beyond the finned plate. Preferably, a heat dissipating means is connected to at least one end of the heat conducting member to assist in heat dissipation.

In a second embodiment of the invention, a fan assembly for an integrated circuit comprises a finned plate, a board member, and a heat conducting member. The finned plate includes a plurality of rows and columns of fins extending upwardly from an upper side thereof and a space defined in a center of the upper side, each two adjacent fins having a gap defined therebetween.

The board member is securely mounted to the finned plate and includes a hole defined in a mediate portion thereof, a support member provided in the hole and connected to a periphery defining the hole by a plurality of ribs, and a fan rotatably mounted to the support member. The heat conducting member is securely connected to an integrated circuit or one gap of the finned plate.

Other objects, advantages, and novel features of the invention will become more apparent from the following detailed description when taken in conjunction with the accompanying drawings.

DESCRIPTION OF THE PREFERRED EMBODIMENTS

Figure 1:
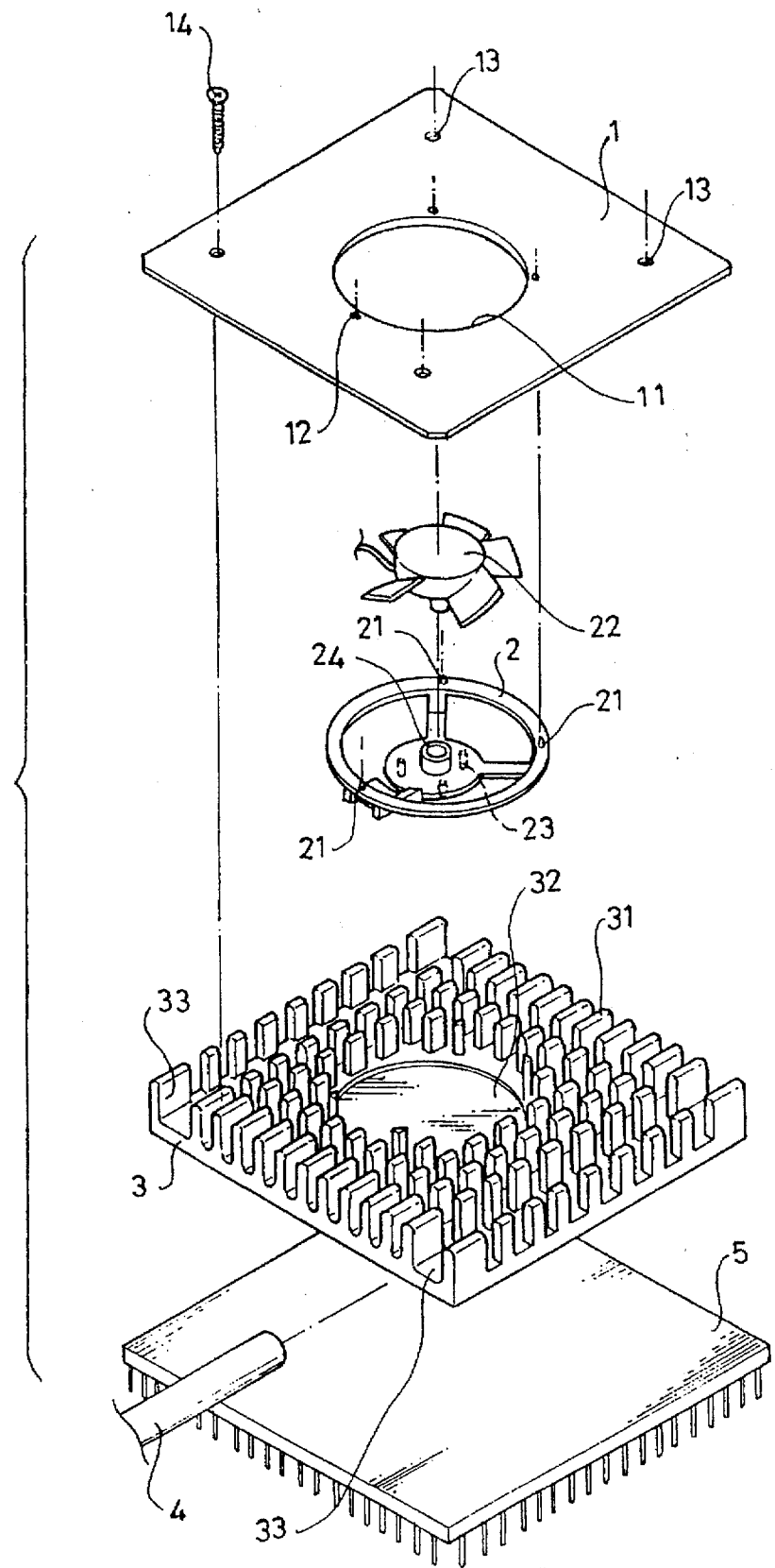
FIG. 1 is an exploded perspective view of a first embodiment of a fan assembly for an integrated circuit in accordance with the present invention.
Figure 2:
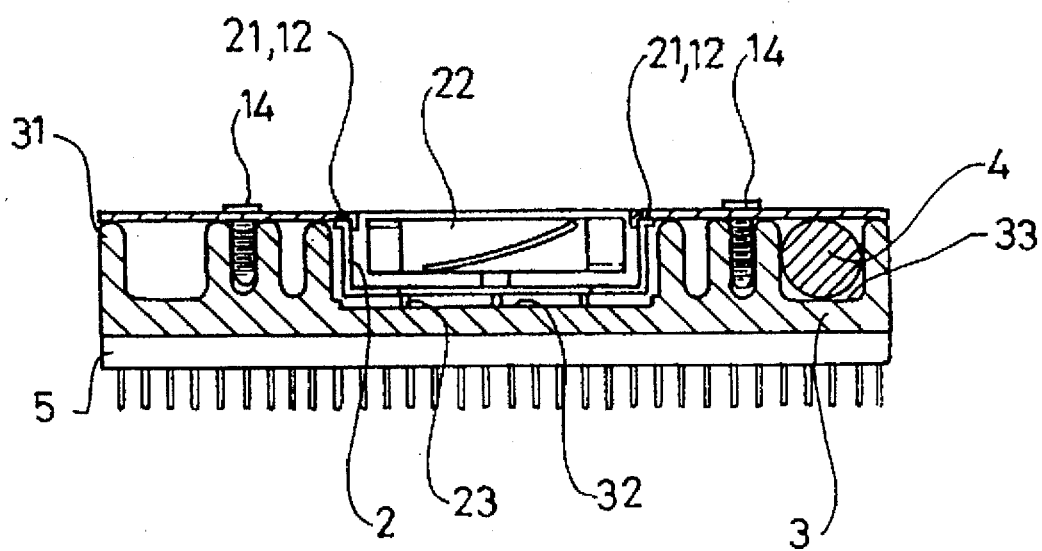
FIG. 2 is a cross-sectional view of the fan assembly in FIG. 1.

Referring to the drawings and initially to FIGS. 1 to 2, a first embodiment of a fan assembly for an integrated circuit in accordance with the present invention generally includes a finned plate 3, a board member 1, a fan means 2, and a heat conducting member 4 securely connected to an integrated circuit 5 or the finned plate 3. The finned plate 3 includes a plurality of rows and columns of fins 31 extending upwardly from an upper side thereof and a space 32 defined in a center of the upper side, each two adjacent fins 31 having a gap 33 defined therebetween for air circulation purpose. The finned plate 3 includes a flat bottom side for contacting with an upper side of an integrated circuit 5 and is made of materials having excellent heat dissipation characteristics, such as aluminum, copper, etc. Preferably, the fins 31 are integral with the finned plate 3 and made of the same material.

The board member 1 is securely mounted to the finned plate 3 by screws 14 extending through screw holes 13 defined therein and includes a hole 11 defined in a mediate portion thereof. In this embodiment, the fan means 2 includes a plurality of pins 21 extending upwardly therefrom, and the board member 1 includes a plurality of holes 12 for receiving the pins 21 of the fan means 2. The fan means 2 further includes a stud having an axle hole 24 for rotatably receiving a fan 22.

Preferably, the fan means 2 includes a plurality of spacers 23 which extend downwardly from a button side thereof to contact with the upper side of the finned plate 3 defining the space 32, thereby defining a space between the fan 22 and the finned plate 3 such that the fan 22 will not be overheated by the heat dissipated from the finned plate 3.

The heat conducting member 4 includes a first end fittingly received in one of the gaps 33 of the finned plate 3 and a second end extending beyond the finned plate 3 for heat dissipation. Alternatively, the heat conducting member 4 can be directly attached to the integrated circuit 5 to have a greater contact area for heat dissipation. Preferably, a heat dissipating means (not shown), e.g. a fan, is connected to at least one end of the heat conducting member 4 to assist in heat dissipation. Preferably, the heat conducting member 4 is made of materials having excellent heat dissipation characteristics, such as copper.

By such an arrangement, heat generated by the integrated circuit 5 can be effectively and rapidly dissipated under rotation of the fan 22, while the heat conducting member 4 also assists in heat conduction by heat exchange with air or other heat dissipating means.

Figure 3:
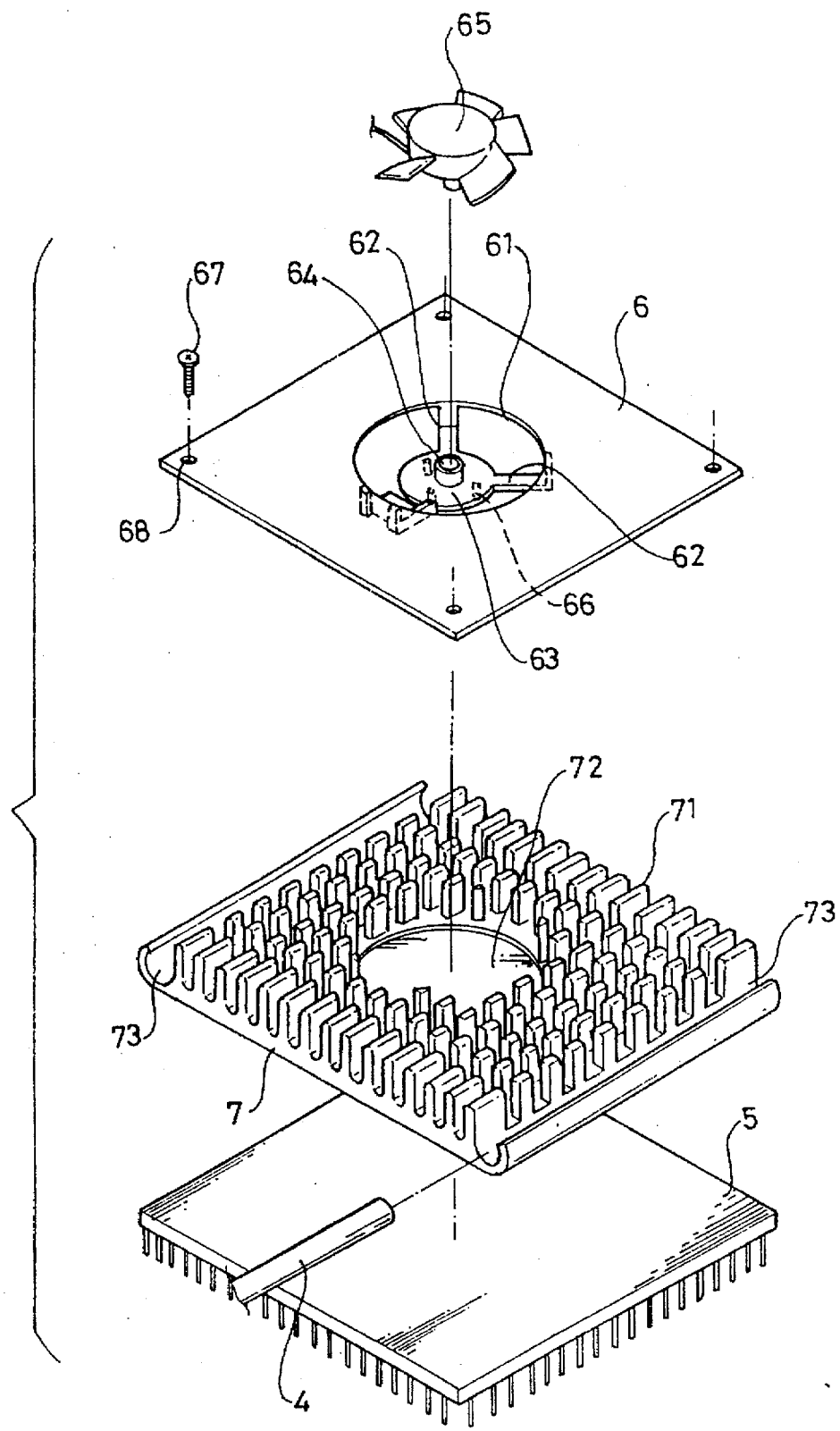
FIG. 3 is an exploded perspective view of a second embodiment of a fan assembly for an integrated circuit in accordance with the present invention.
Figure 4:
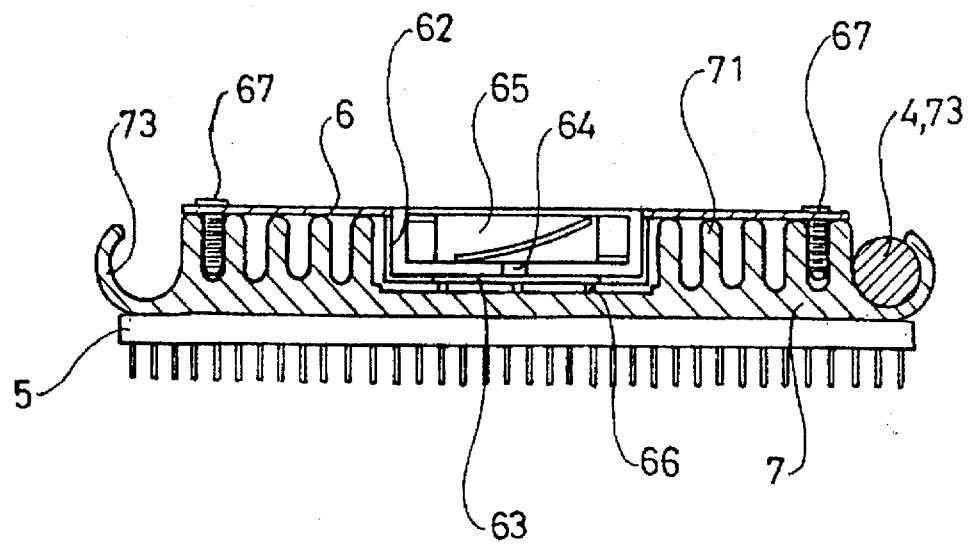
FIG. 4 is a cross-sectional view of the fan assembly in FIG. 3.

Referring now to FIGS. 3 and 4, a second embodiment of a fan assembly for an integrated circuit in accordance with the present invention includes a finned plate 7, a board member 6, and a heat conducting member 4. The finned plate 7 includes a plurality of rows and columns of fins 71 extending upwardly from an upper side thereof and a space 72 defined in a center of the upper side, each two adjacent fins 71 having a gap 73 defined therebetween. The finned plate 7 includes a flat bottom side for contacting with an upper side of an integrated circuit 5. The finned plate 7 is made of materials having excellent heat dissipation characteristics, such as aluminum, copper, etc. Preferably, the fins 71 are integral with the finned plate 7 and made of the same material.

The board member 6 is securely mounted to the finned plate 7 by screws 67 extending through screw holes 68 and includes a hole 61 defined in a mediate portion thereof. A support member 63 is provided in the hole 61 and connected to a periphery defining the hole 61 by a plurality of ribs 62. The support member 63 further has a stud having an axle hole 64 for rotatably receiving a fan 65.

Preferably, the support member 63 includes a plurality of spacers 66 which extend downwardly therefrom to contact with the upper side of the finned plate 7 defining the space 72, thereby defining a space between the fan 65 and the finned plate 7 such that the fan 65 will not be overheated by the heat dissipated from the finned plate 7.

Again, the heat conducting member 4 includes a first end fittingly received in one of the gaps 73 of the finned plate 7 and a second end extending beyond the finned plate 7 for heat dissipation. Alternatively, the heat conducting member 4 can be directly attached to the integrated circuit 5 to have a greater contact area for heat dissipation. Preferably, a heat dissipating means is connected to at least one end of the heat conducting member 4 to assist in heat dissipation. Preferably, the heat conducting meter 4 is made of materials having excellent heat dissipation characteristics, such as copper.

By such an arrangement, heat generated by the integrated circuit 5 can be effectively and rapidly dissipated under rotation of the fan 65, while the heat conducting member 4 also assists in heat conduction by heat exchange with air or other heat dissipating means.

Figure 5:
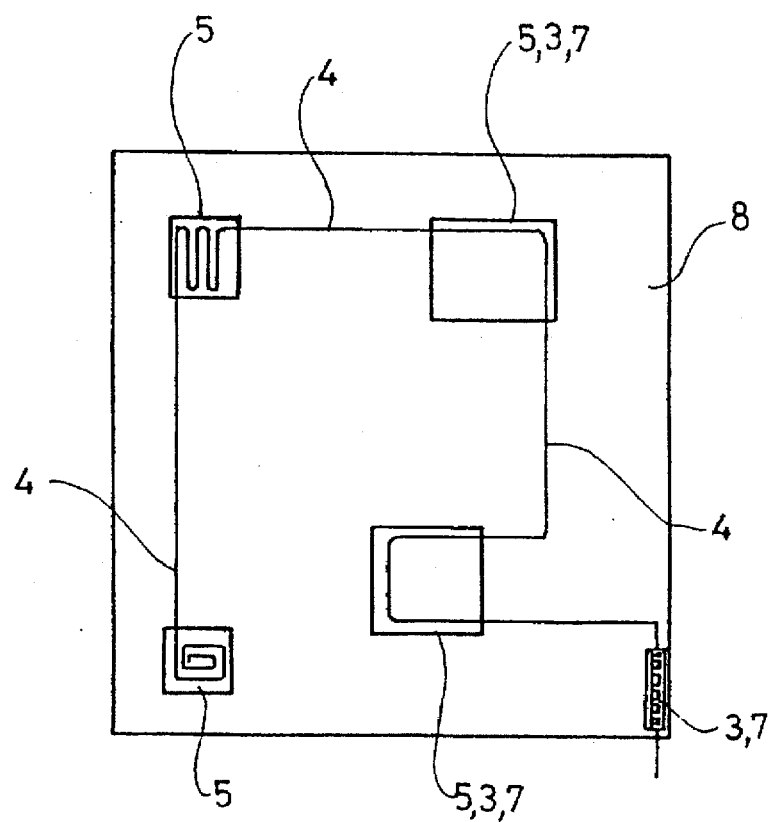
FIG. 5 is a top plan view illustrating application of the fan assembly of the present invention.

FIG. 5 illustrates an application of the present invention on a circuit board 8 having a plurality of integrated circuits 5. For an integrated circuit 5 having a relatively large surface area, the finned plate 3, 7 can be directly mounted to an upper side of the integrated circuit 5. For an integrated circuit 5 having a relatively small surface area, the heat conducting member 4 may be applied therethrough and extend through the finned plate 3, 7 with an end thereof extending beyond the finned plate 3, 7. Alternatively, additional heat dissipating means, such as fans, can be provided to cool the end of the heat conducting member 4, thereby providing the best heat dissipating effect for the integrated circuits 5.

Although the invention has been explained in relation to its preferred embodiment, it is to be understood that many other possible modifications and variations can be made without departing from the spirit and scope of the invention as hereinafter claimed.

What is claimed is:

1. A fan assembly for an integrated circuit comprising:

a finned plate (3) including a plurality of rows and columns of fins (31) extending upwardly from an upper side thereof and a space (32) defined in a center of the upper side, each two said adjacent fins (31) having a gap (33) defined therebetween;

a board member (1) securely mounted to the finned plate (3) and including a hole (11) defined in a mediate portion thereof;

a fan device (2) mounted to the board member (1) and having a fan (22) rotatably received in the space (32) of the finned plate (3) the fan device (2) further including a plurality of spacers (23) extending downwardly from a bottom side thereof in contact with the upper side of the finned plate (3) defining the space (32); and a heat conducting member (4) securely connected to one of the finned plate (3) and an integrated circuit (5).

2. The fan assembly as claimed in claim 1, wherein the fan device (2) includes a plurality of pins (21) extending upwardly therefrom, and the board member (1) includes a plurality of holes (12) for receiving the pins (21) of the fan device (2).

3. The fan assembly as claimed in claim 1, wherein the heat conducting member (4) includes a first end fittingly received in one of the gaps (33) of the finned plate (3) and a second end extending beyond the finned plate (3).

4. The fan assembly as claimed In claim 3, further comprising a heat dissipating device connected to at least one of said ends of the heat conducting member (4).

* * * * *